(12) United States Patent
Kim et al.

(10) Patent No.: US 12,317,440 B2
(45) Date of Patent: May 27, 2025

(54) DISPLAY DEVICE

(71) Applicant: LG ELECTRONICS INC., Seoul (KR)

(72) Inventors: Kitae Kim, Seoul (KR); Jinuk Baek, Seoul (KR); Younghoon Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 243 days.

(21) Appl. No.: 18/015,218

(22) PCT Filed: Jun. 25, 2021

(86) PCT No.: PCT/KR2021/007994
§ 371 (c)(1),
(2) Date: Jan. 9, 2023

(87) PCT Pub. No.: WO2022/010143
PCT Pub. Date: Jan. 13, 2022

(65) Prior Publication Data
US 2023/0269887 A1    Aug. 24, 2023

(30) Foreign Application Priority Data

Jul. 10, 2020  (KR) .................. 10-2020-0085718

(51) Int. Cl.
*H05K 5/30* (2025.01)
*H05K 5/02* (2006.01)
(Continued)

(52) U.S. Cl.
CPC ............ *H05K 5/30* (2025.01); *H05K 5/0217* (2013.01); *H05K 5/0247* (2013.01); *H05K 9/0015* (2013.01); *H01L 25/0753* (2013.01)

(58) Field of Classification Search
CPC .. H05K 5/0017; H05K 5/0217; H05K 5/0021; H05K 5/0247
(Continued)

(56) References Cited

U.S. PATENT DOCUMENTS

| | | | |
|---|---|---|---|
| 2014/0043773 A1* | 2/2014 | Lin .................. | H05K 7/10 361/728 |
| 2018/0031919 A1* | 2/2018 | Ryu .................. | H01F 7/0221 |

(Continued)

FOREIGN PATENT DOCUMENTS

| | | | | |
|---|---|---|---|---|
| CN | 106448479 A | * | 2/2017 | ............... H05K 5/02 |
| CN | 210223396 U | * | 3/2020 | ............... H05K 7/14 |

(Continued)

*Primary Examiner* — Hung S. Bui
(74) *Attorney, Agent, or Firm* — Birch, Stewart, Kolasch & Birch, LLP

(57) ABSTRACT

The display device includes a plurality of display modules arranged in an up and down direction and in a left and right direction, and the display module includes a unit frame; an inner plate coupled to the unit frame and having an inner opening; a control board disposed behind the inner plate and having a rear connector on the front surface; a back cover covering the control board; and a front display assembly disposed in front of the unit frame. The front display assembly may include at least one display panel, and a rear connector and a detachable front connector may be disposed. At least one of the rear connector and the front connector may pass through the inner opening.

20 Claims, 18 Drawing Sheets

(51) Int. Cl.
  *H05K 9/00*      (2006.01)
  *H01L 25/075*    (2006.01)
(58) Field of Classification Search
  USPC .......................................... 361/807, 809, 810
  See application file for complete search history.

(56)           References Cited

U.S. PATENT DOCUMENTS

2019/0180673  A1*  6/2019  Yoon .................... G09F 9/3026
2020/0063767  A1*  2/2020  Jung ........................ H05K 7/02

FOREIGN PATENT DOCUMENTS

KR           10-1043987  B1    6/2011
KR       10-2016-0097599  A    8/2016
KR           10-1864027  B1    6/2018
KR       10-2020-0023147  A    3/2020
KR       10-2020-0023151  A    3/2020
WO        WO 2019/210513  A1  11/2019

\* cited by examiner

[Fig. 6]
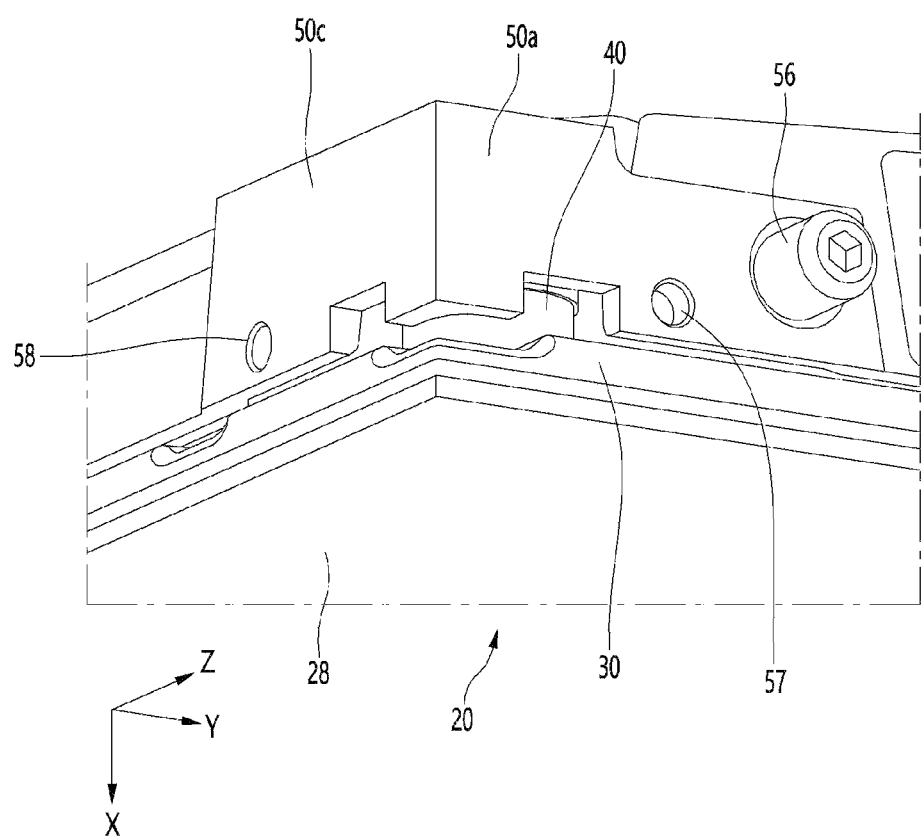

[Fig. 7]
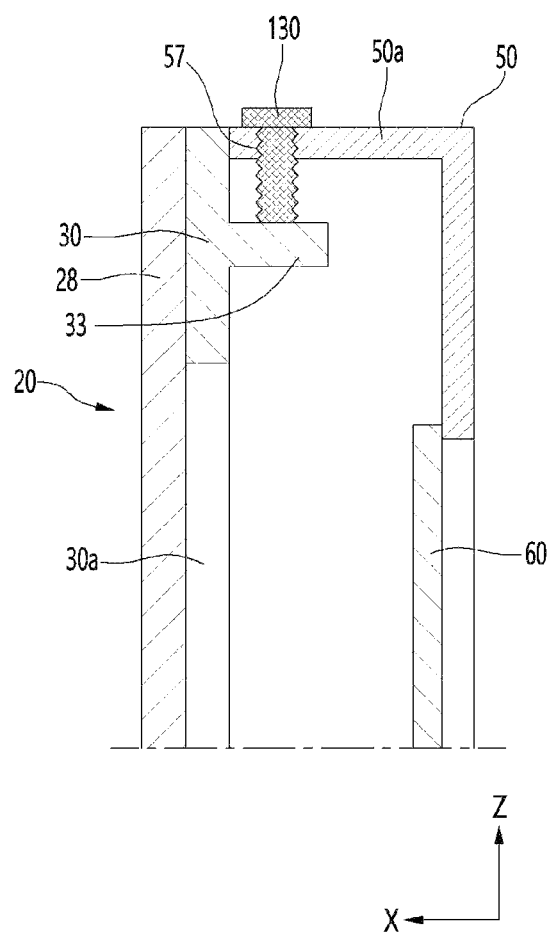

[Fig. 8]
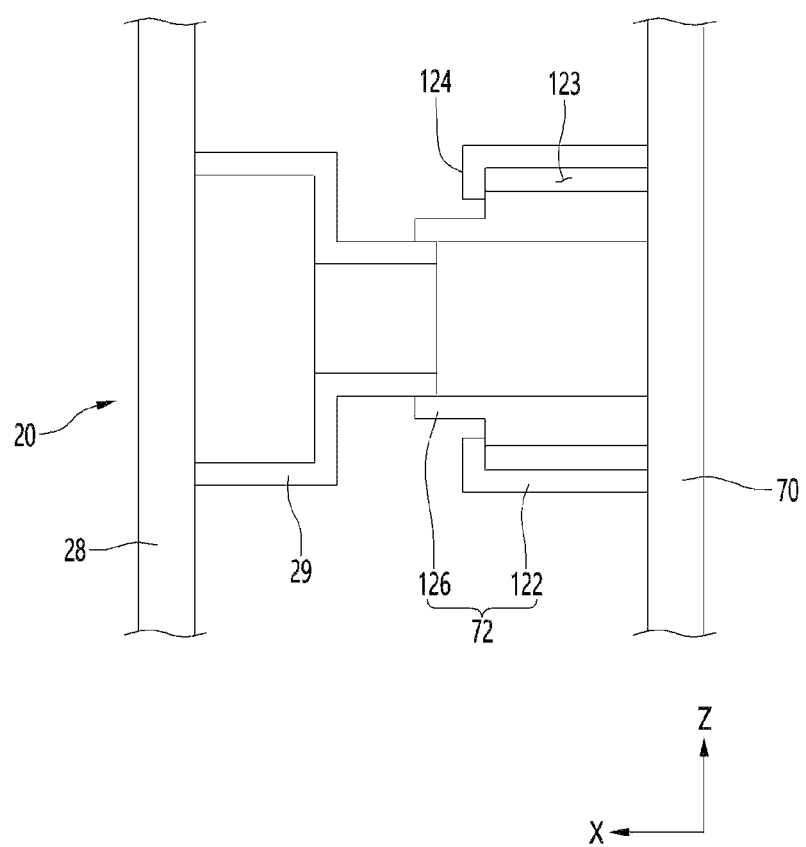

[Fig. 9]
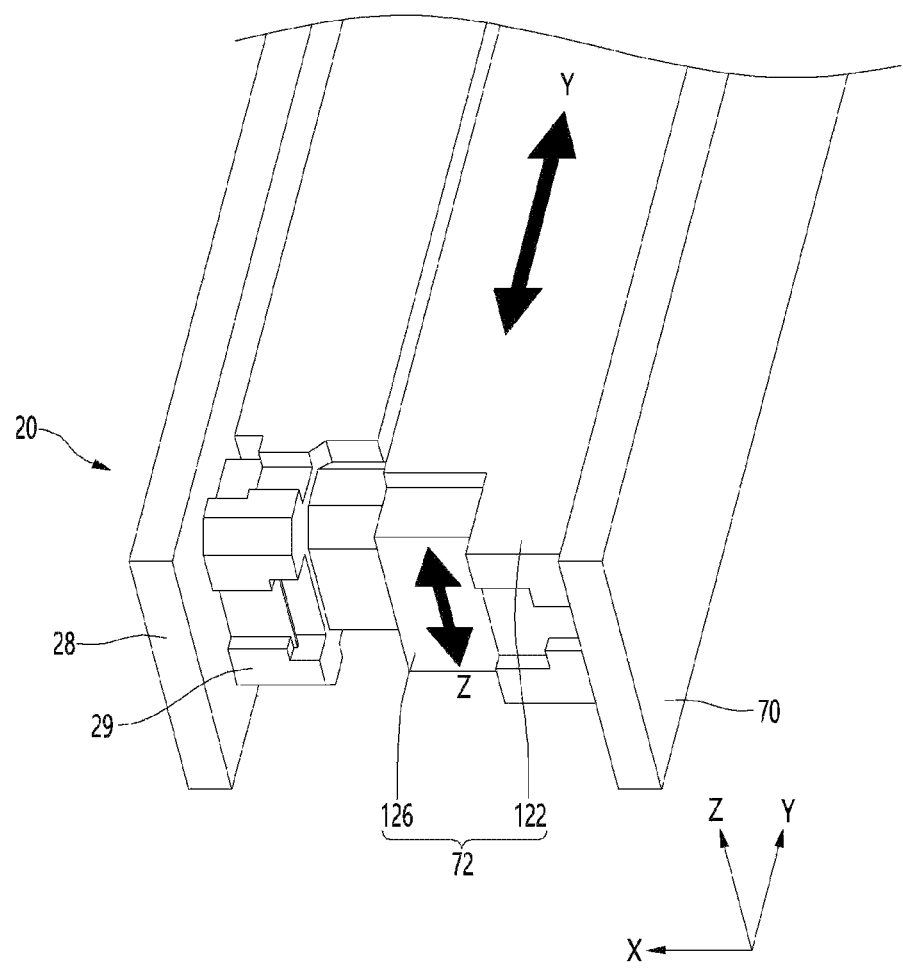

[Fig. 10]
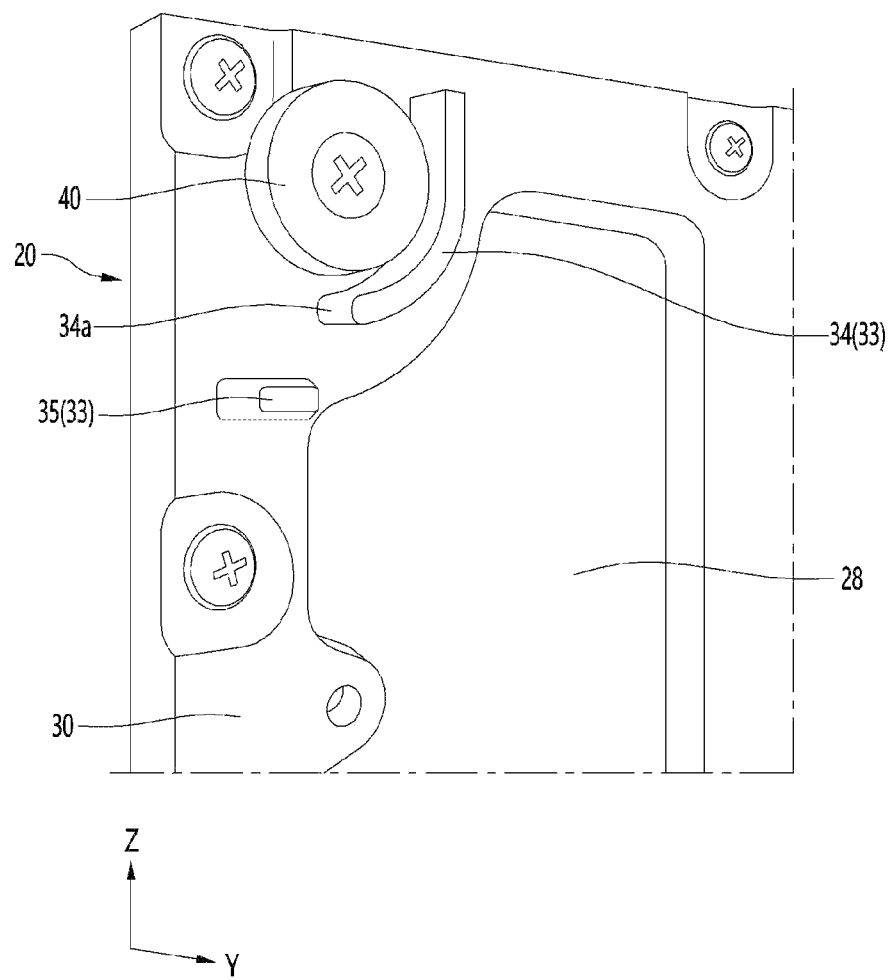

[Fig. 11]
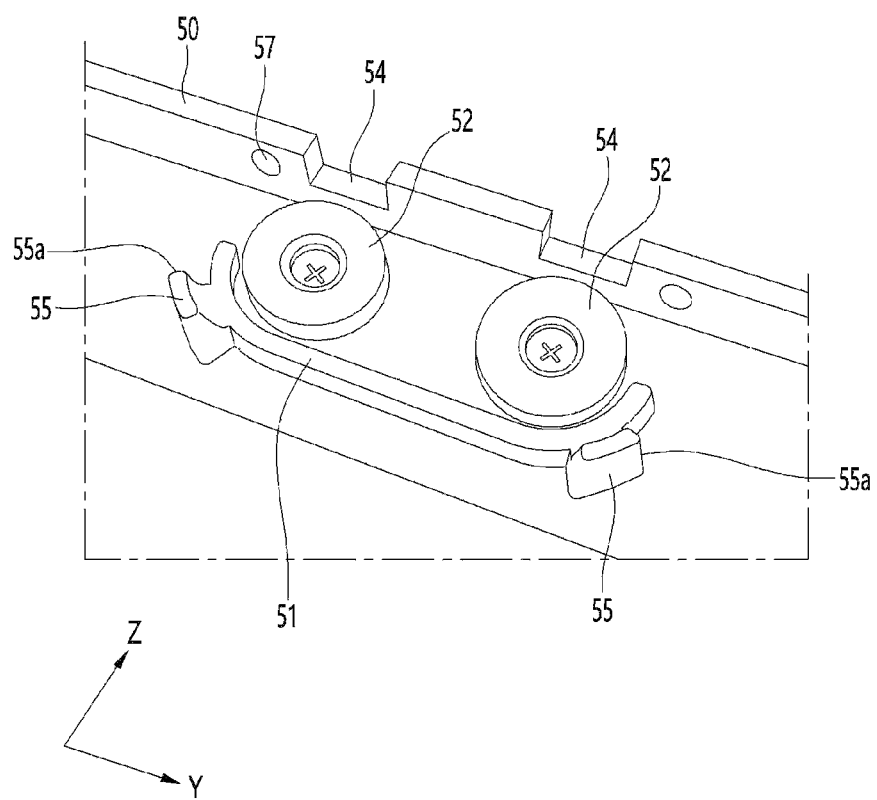

[Fig. 12]
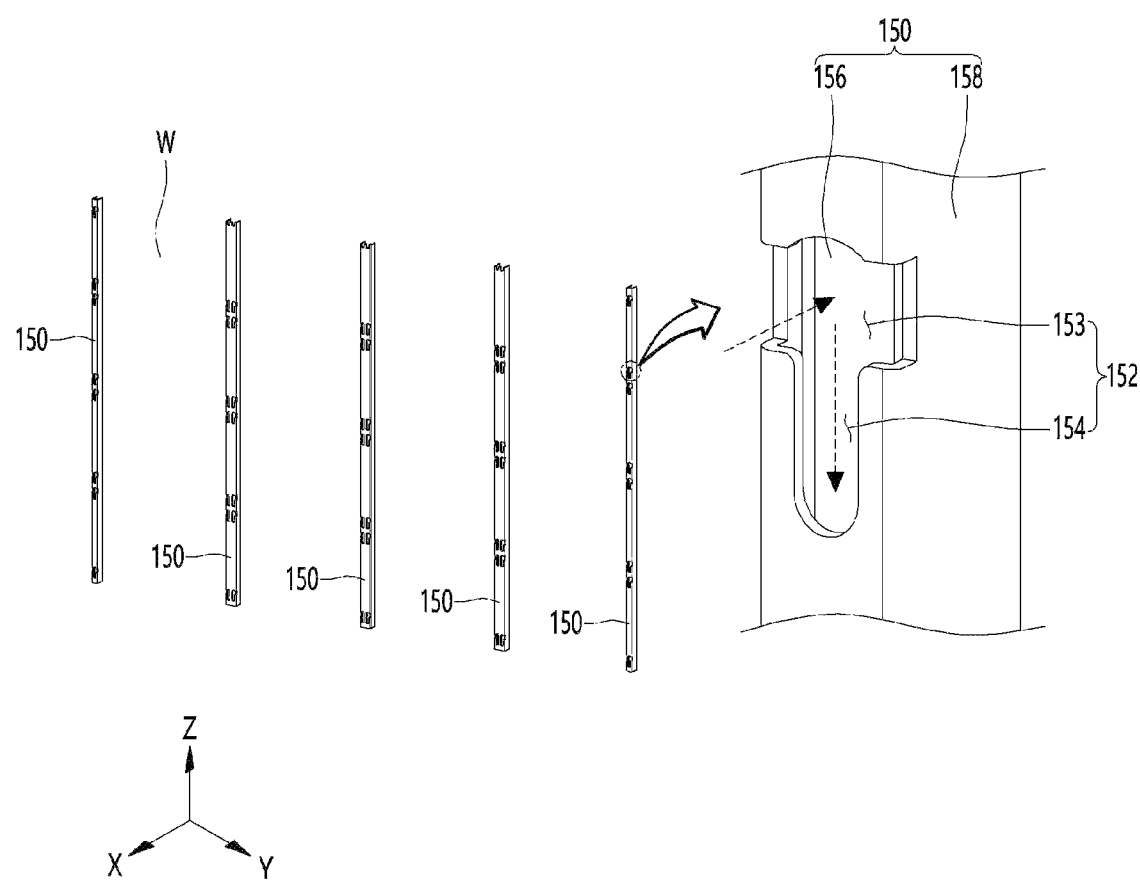

[Fig. 13]
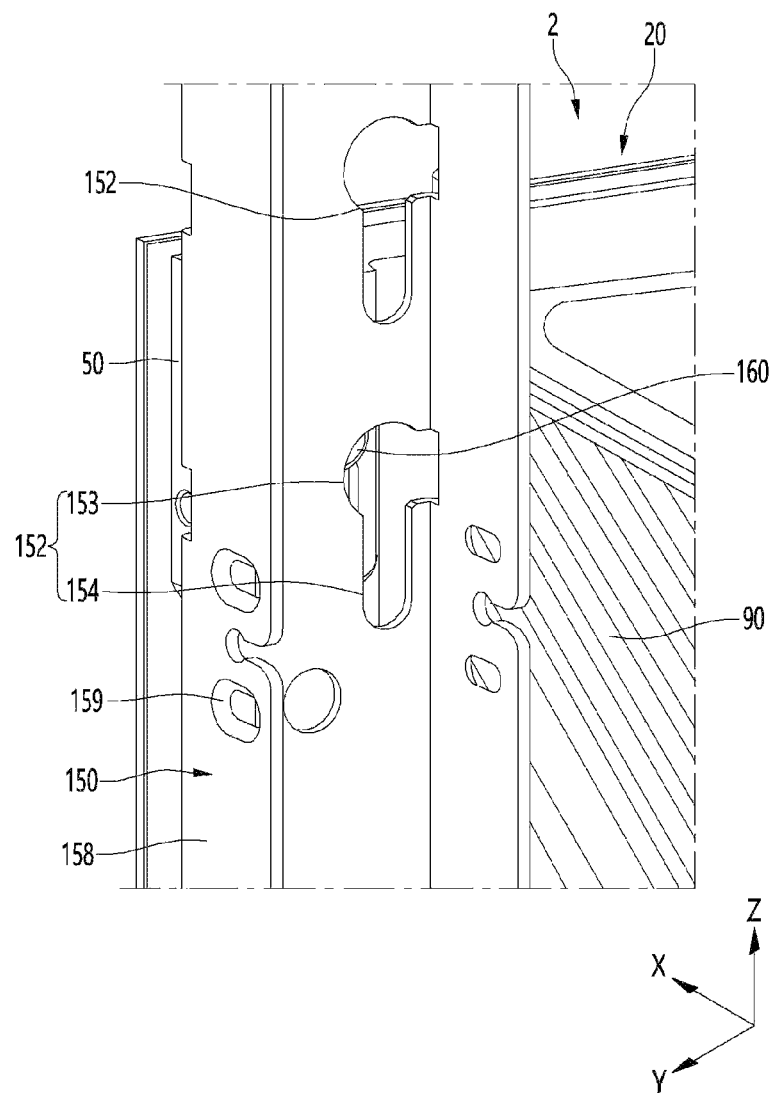

[Fig. 14]
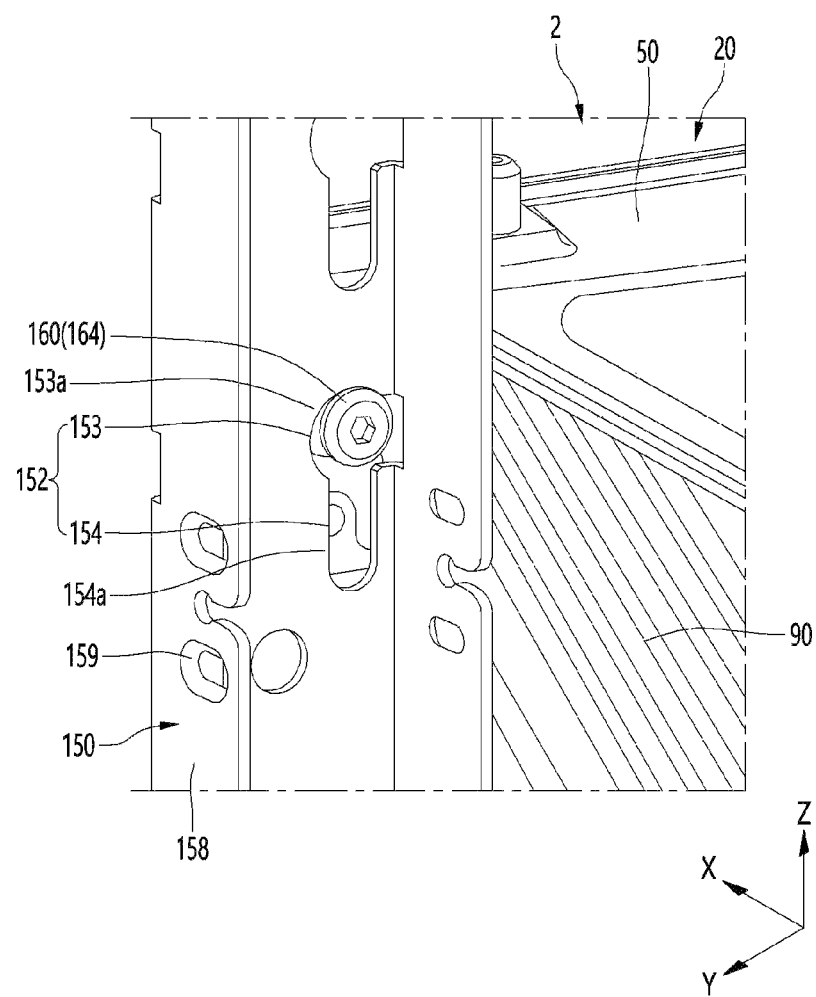

[Fig. 15]
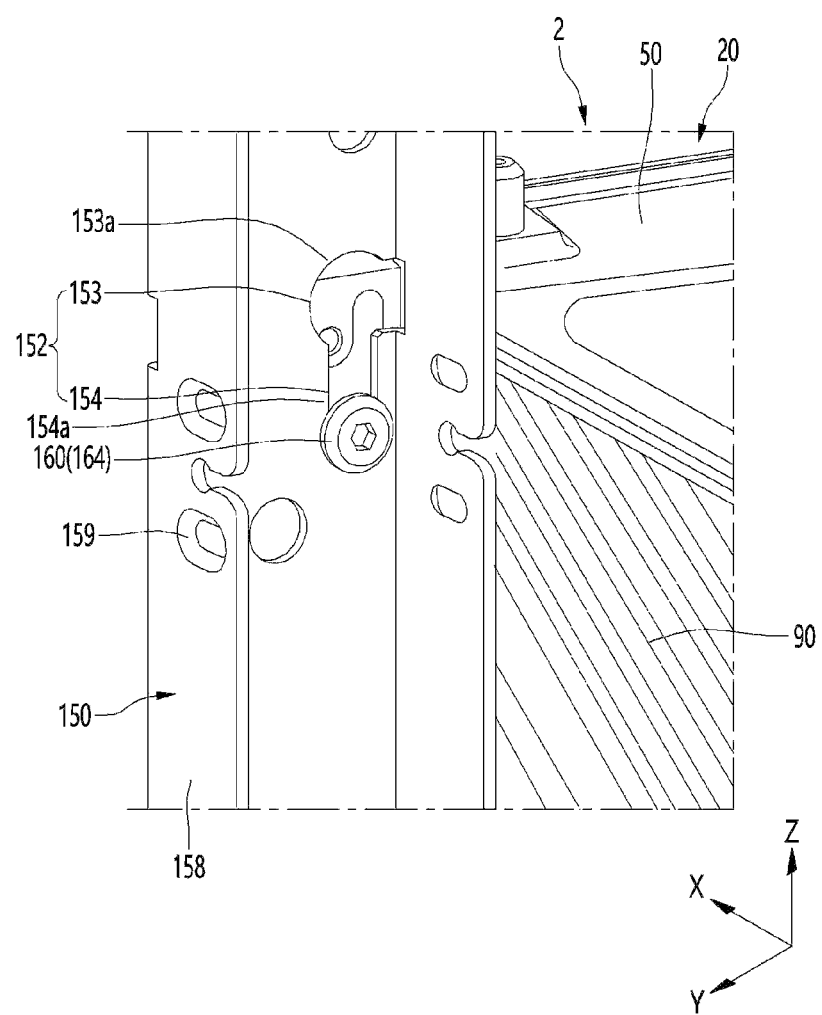

[Fig. 16]
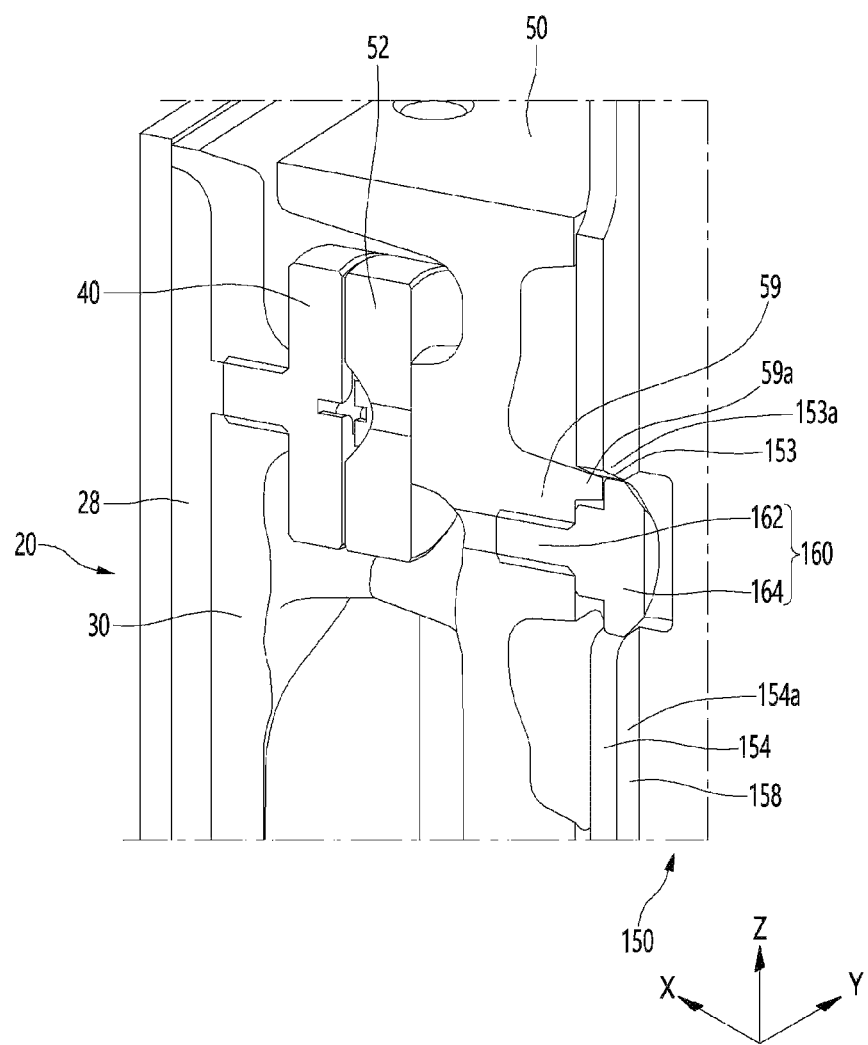

[Fig. 17]
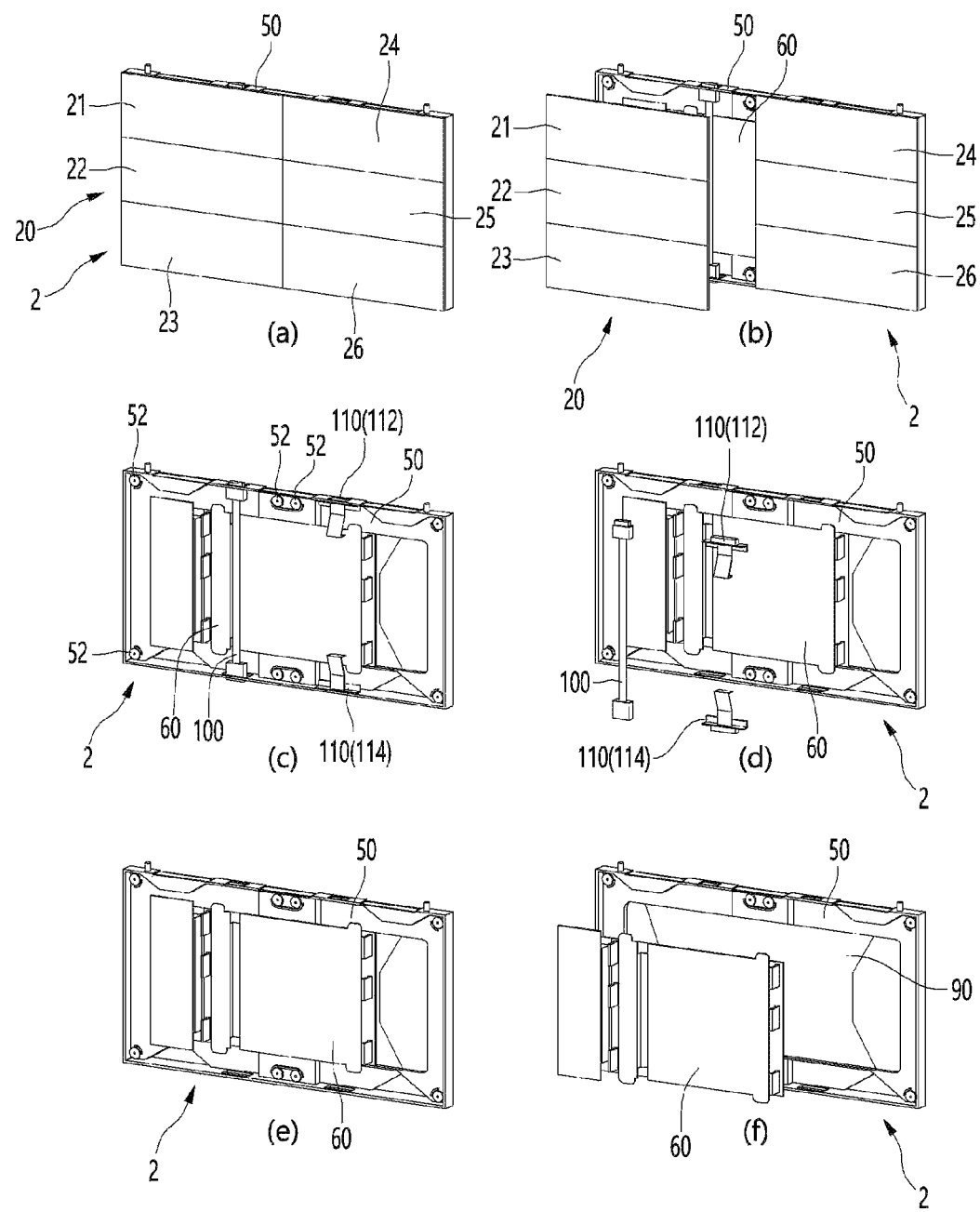

[Fig. 18]
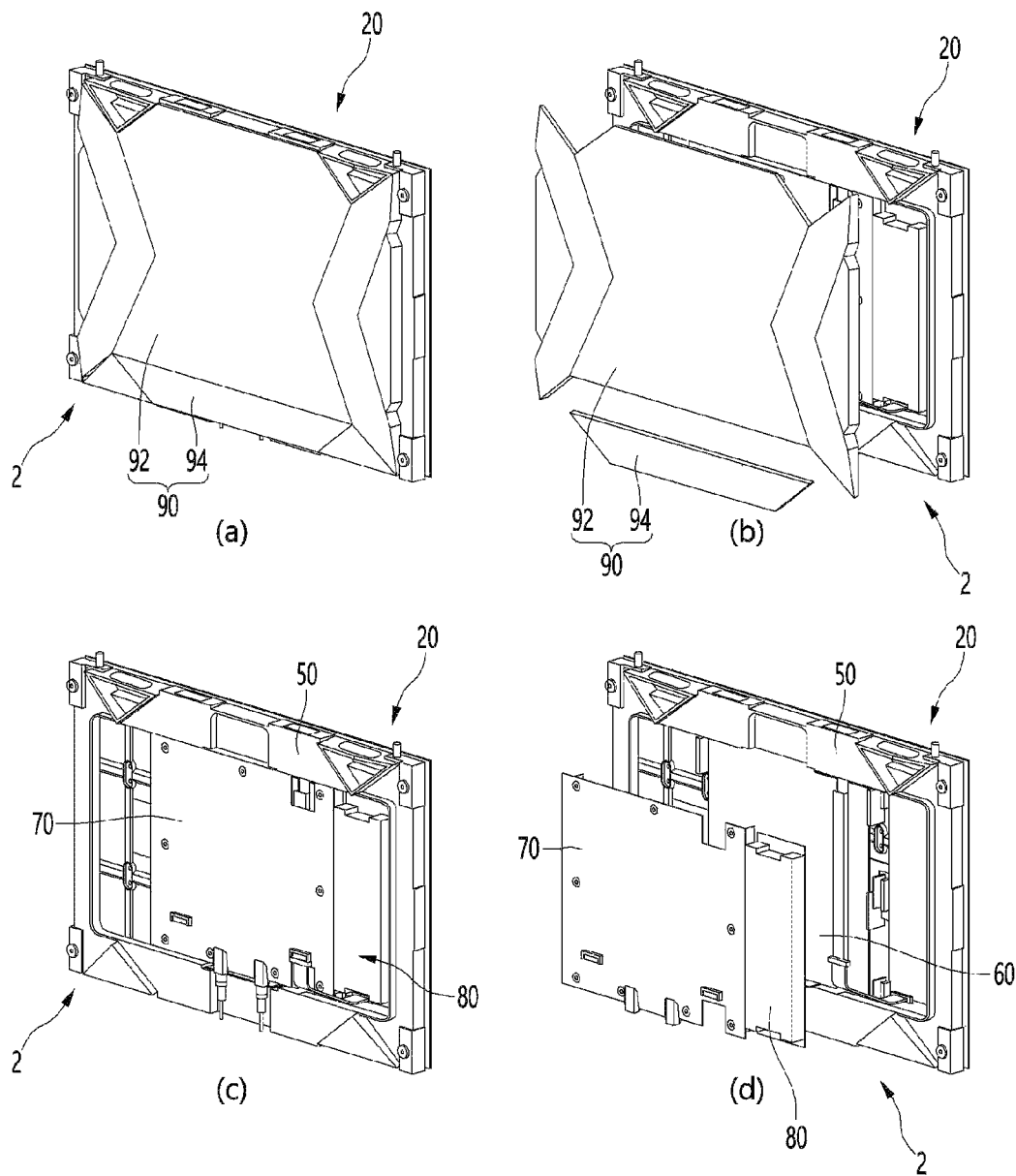

DISPLAY DEVICE

CROSS REFERENCE TO RELATED APPLICATIONS

This application is the National Phase of PCT/KR2021/007994 filed on Jun. 25, 2021, which claims priority under 35 U.S.C. § 119 (a) to Patent Application No. 10-2020-0085718 filed in the Republic of Korea on Jul. 10, 2020, all of which are hereby expressly incorporated by reference into the present application.

TECHNICAL FIELD

The present disclosure relates to a display device.

BACKGROUND ART

In recent display devices, a plurality of display modules including a display panel are arranged together to form a large-sized screen.

A display device may implement a large-sized screen by combining a plurality of display panels.

An example of a display device in which a plurality of display panels are arranged is disclosed in a display module disclosed in Korean Patent Publication No. 10-2016-0097599 A (published on Aug. 18, 2016) and a display device including the same, such a display device includes a cabinet; and a display module having a plurality of LED panels disposed in the cabinet, wherein the cabinet includes a base plate on which the plurality of LED panels are mounted, a side wall, a door coupled to the side wall by a hinge, and a power terminal and a switch provided on the side wall or the door, a signal control board for controlling the plurality of LED panels and a power supply for supplying power to the LED panels are disposed inside the cabinet, and the cabinet includes at least one connection device provided to be capable of being combined with another display module.

In the display module, the rear cover of the cabinet is provided as a hinged door to provide convenience during maintenance of the display.

DISCLOSURE

Technical Problem

An object of the present disclosure is to provide a display device with convenient service.

Technical Solution

The display device according to the present embodiment includes a plurality of display modules arranged in an up and down direction and in a left and right direction, and the display module includes a unit frame; an inner plate coupled to the unit frame and having an inner opening; a control board disposed behind the inner plate and having a rear connector on the front surface; a back cover covering the control board; and a front display assembly including at least one display panel and disposed in front of the unit frame.

The front display assembly may further include a front connector detachable from the rear connector.

At least one of the rear connector and the front connector may pass through the inner opening.

The display device may include a magnet disposed on the front surface of the unit frame; and an adjustment screw screwed to the front display assembly and attachable to the magnet by magnetic force.

An adjustment hole facing the adjustment screw may be formed in the unit frame.

The front display assembly may further include a display holder.

The display panel is arranged on a front surface of the display holder.

The display holder may protrude a position adjustment protrusion. The unit frame may have a fastening hole which is opened toward the position adjustment protrusion. The display device may further include a set screw that adjusts the position of the display holder by tightening or loosening the fastening hole.

The rear connector may include a fixed connector fixed to the front surface of the control board and having a space therein, and a moving connector movably accommodated in the space in the up and down direction and in the left and right direction and detachable from the front connector.

The display device may further include a guide pin protruding from an upper end of the unit frame.

The display module may include a power docking module passing through the display module in the up and down direction.

The power docking module may include a first power connector disposed on an upper end of the unit frame; a second power connector disposed on a lower end of the unit frame; and a power cable connected to the first power connector and the second power connector.

A power cable accommodation portion in which the power cable is accommodated may be formed to be elongated in an up and down direction on the inner plate.

The display panel may include a substrate which has a front surface on which a display element is provided and a rear surface on which the front connector is disposed.

The display holder may have an opening through which the front connector passes.

A portion of the display holder other than the opening may face the power cable accommodating portion.

The display device may further include a first communication module disposed to be spaced apart from a first power connector on the upper end of the unit frame; and a second communication module disposed to be spaced apart from the second power connector at the lower end of the unit frame.

The display module may include an EMI gasket disposed on the inner plate.

The display holder may include a gasket contact portion which is in contact with a front surface of the EMI gasket.

The display module may include a mounting pin disposed to protrude rearward from the unit frame and mounted in a mounting hole formed in a wall mounter.

The mounting pin may have a rear head caught around the mounting hole.

The wall mounter may include an inner mounter fixed to a wall; and an outer mounter fastened to the inner mounter with a fastening member and having a mounting hole formed therein.

The mounting hole may include an upper mounting hole larger than the rear head; and a lower guide hole extending downward to be elongated from the upper mounting hole, and in which the width of the lower guide hole in the left and right direction may be shorter than the width of the rear head in the left and right direction.

A rear pin fastening portion to which the rear pin is fastened may be formed on the unit frame.

A protrusion preventing interference between the rear head and the peripheral portion of the upper mounting hole may be formed on the rear pin fastening portion, and the protrusion may protrude toward the rear head.

Advantageous Effect

According to the present embodiment, after separating the front display assembly from the unit frame, there is an advantage in that the control board can be serviced by a simple operation of separating the inner plate from the unit frame.

In addition, the control board can be serviced by simply separating the control board from the inner plate after separating the back cover.

In addition, the step difference of the display panel can be eliminated by adjustment screws attached to the magnets.

In addition, since the adjustment screw can be adjusted through the adjustment hole, the adjustment screw can be adjusted without disassembling the display device.

In addition, by fastening the set screw to the fastening hole of the unit frame, the position of the display holder can be adjusted, the plurality of display panels may be in close contact with each other, and the formation of a bezel between the plurality of display panels may be minimized.

In addition, in a state where the rear connector is configured as a floating connector and is connected to the display panel and the control board through the front connector and the rear connector, the position of the display panel may be finely adjusted.

In addition, the display module located on the upper side is guided by the guide pin of the display module located on the lower side, so that a plurality of display modules can be stacked accurately and stably.

In addition, the power docking module can stably supply power to the display modules stacked in the up and down direction.

In addition, the power cable of the power docking module may be accommodated between the power cable accommodation portion of the inner plate and the display holder, and the power cable accommodation portion may protect the power cable together with the display holder.

In addition, the first power connector and the second power connector may be hidden in the unit frame and protected by the unit frame.

In addition, the display modules stacked in the up and down direction can stably communicate with each other by the first communication module and the second communication module, and the first communication module and the second communication module can be hidden in the unit frame and protected by the unit frame.

In addition, the grounding of the display module may be strengthened by contacting the EMI gasket to the display holder.

In addition, the mounting pins of the display module can be easily mounted on mounting holes formed in the wall mounter.

In addition, when the display module mounting pin is taken out of the mounting hole formed on the wall mounter, the mounting pin does not get caught on the peripheral portion of the mounting hole and can be easily pulled out through the mounting hole, and thus there is an advantage in that the separation of the display module and the wall mounter is easy.

DESCRIPTION OF DRAWINGS

FIG. 6 is an enlarged perspective view illustrating a unit frame according to the present embodiment, FIG. 7 is a cross-sectional view illustrating a state when adjusting the position of the front display assembly according to the present embodiment, FIG. 8 is a perspective view illustrating a state when a rear connector and a front connector according to the present embodiment are connected, FIG. 9 is a cross-sectional view illustrating a state when a rear connector and a front connector according to the present embodiment are connected, FIG. 10 is a view illustrating a portion of the display holder according to the present embodiment, FIG. 11 is a view illustrating a portion of a unit frame according to the present embodiment, FIG. 12 is a perspective view illustrating a wall mounter according to the present embodiment, FIG. 13 is a perspective view illustrating a state when the display module according to the present embodiment is positioned in front of the wall mounter, FIG. 14 is a perspective view illustrating a state when a mounting pin of a display module is inserted into a wall mounter according to the present embodiment, FIG. 15 is a perspective view illustrating a state when the display module illustrated in FIG. 14 is lowered, FIG. 16 is a cross-sectional view illustrating a state when the display module illustrated in FIG. 15 is raised, FIG. 17 is a view illustrating an example of disassembling a display device for service of the display device according to the present embodiment, and FIG. 18 is a view illustrating another example of disassembling a display device for service of the display device according to the present embodiment.

BEST MODE

Hereinafter, specific embodiments of the present disclosure will be described in detail with drawings.

Figure 1:
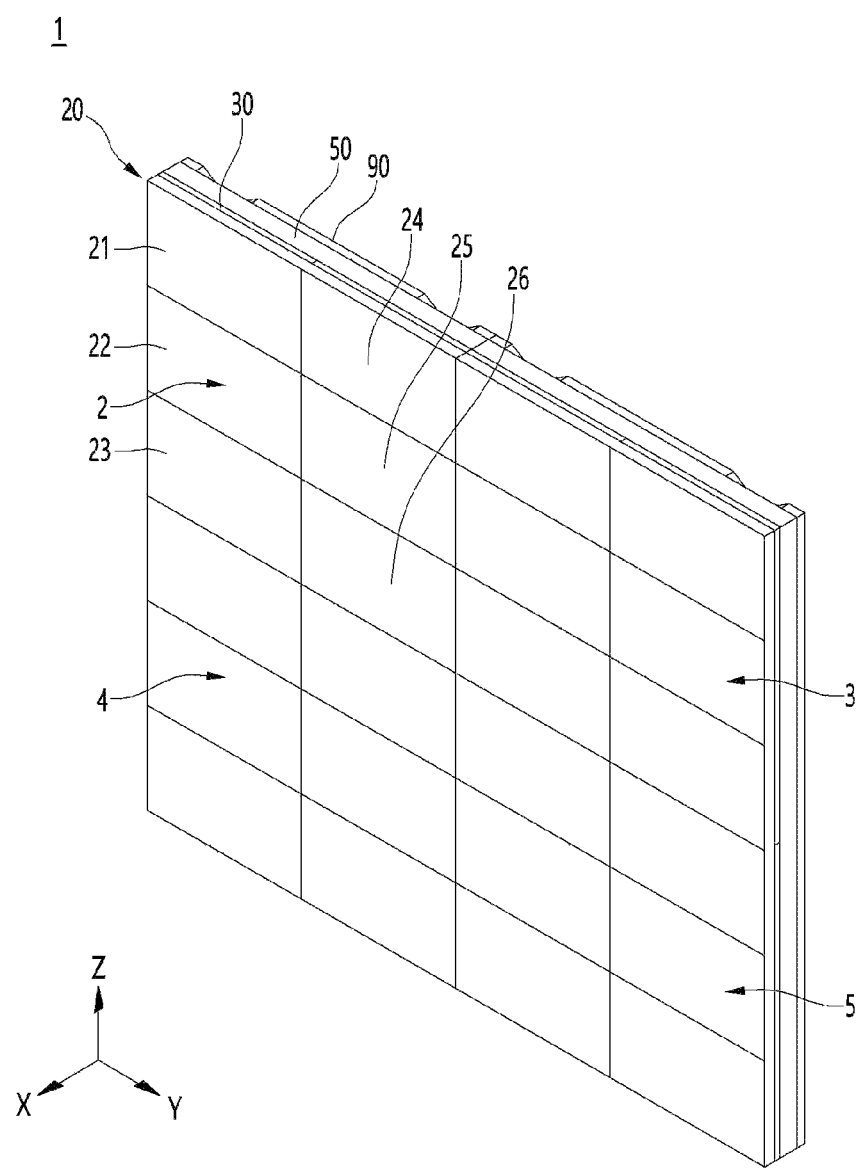
FIG. 1 is a perspective view illustrating a display device according to the present embodiment.

FIG. 1 is a perspective view illustrating a display device according to the present embodiment.

The display device 1 may include a plurality of display modules 2, 3, 4, and 5.

The plurality of display modules 2, 3, 4, and 5 may be arranged in an up and down direction Z and a left and right direction Y.

For example, a total of four display modules may be disposed by disposing two display modules in an up and down direction and two display modules in a left and right direction.

For another example, a total of nine display modules may be disposed by disposing three display modules in an up and down direction and three display modules in a left and right direction.

The display device 1 may be configured in various combinations according to the number of display modules.

Each of the plurality of display modules 2, 3, 4, and 5 may include a front display assembly 20. Each of the plurality of display modules 2, 3, 4, and 5 may further include a unit frame 50 and a back cover 90.

The front display assembly 20 may be disposed in front of the unit frame 50. The front display assembly 20 may cover the front surface of the unit frame 50.

The front display assembly 20 may include a plurality of display panels 21, 22, 23, 24, 25, and 26, and at least one display holder 30.

The display holder 30 may support a plurality of displays 21, 22, 23, 24, 25, and 26.

The plurality of display panels 21, 22, 23, 24, 25, and 26 may be disposed on the display holder 30 in an up and down direction Z and a left and right direction Y, and, for example, four, six, and eight LED panels 21, 22, 23, 24, 25, 26 are disposed together on one plane, and together with the display holder 30, one display module can be configured.

The display modules 3, 4, and 5 may have the same structure and, hereinafter, one display module 2 will be described for convenience of explanation.

Figure 2:
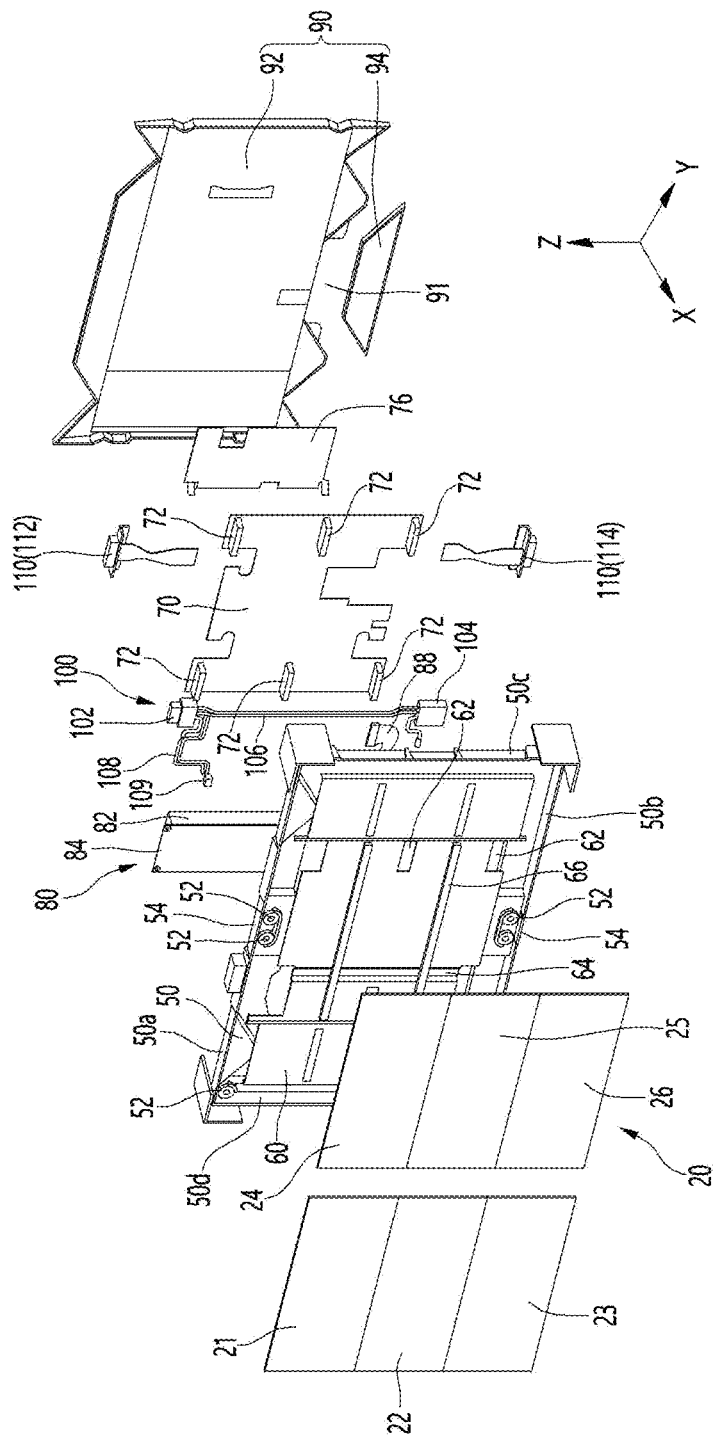
FIG. 2 is an exploded perspective view illustrating the front side of the display module according to the present embodiment.
Figure 3:
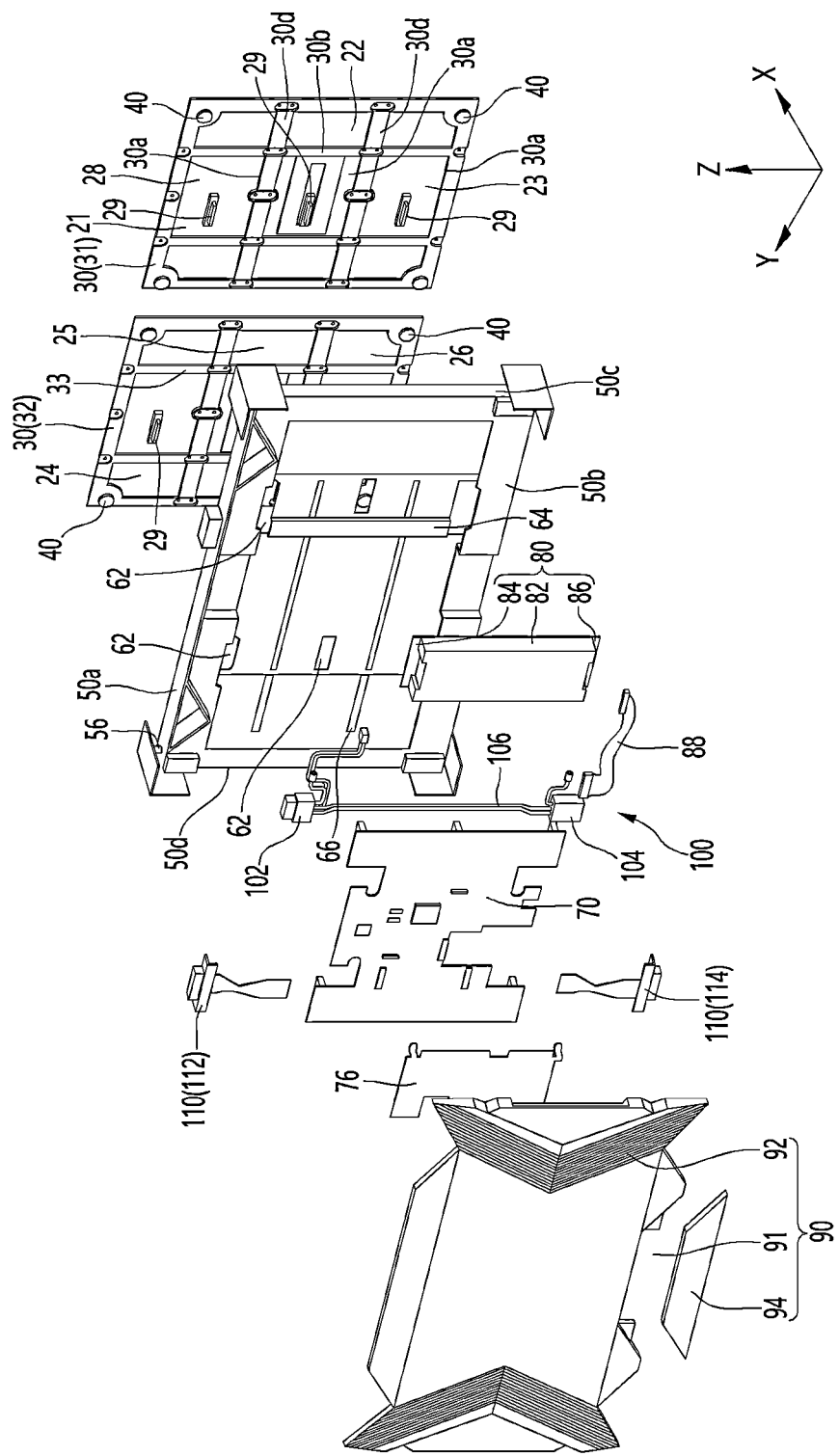
FIG. 3 is an exploded perspective view illustrating the rear side of the display module according to the present embodiment.
Figure 4:
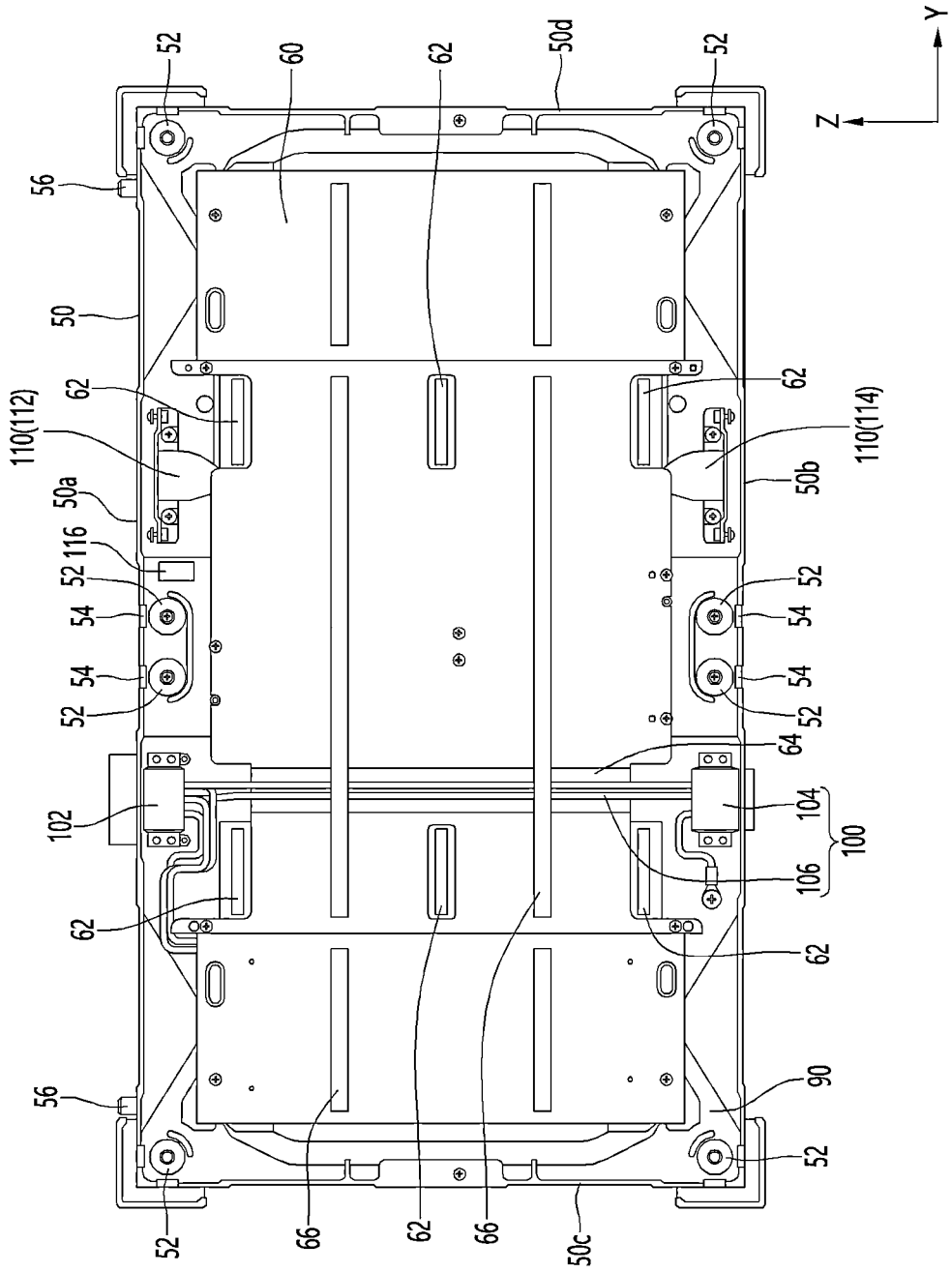
FIG. 4 is a front view illustrating the inside of the display module according to the present embodiment.
Figure 5:
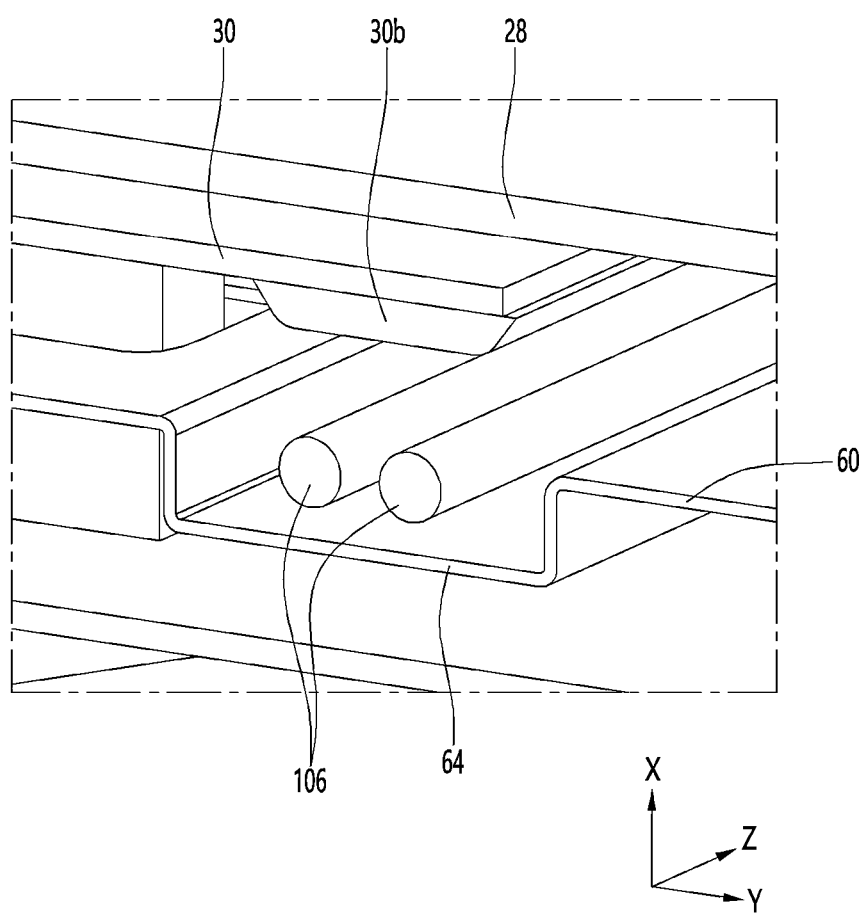
FIG. 5 is a partially cut-away perspective view illustrating an example in which a power cable according to the present embodiment is accommodated in an inner plate.

FIG. 2 is an exploded perspective view illustrating the front side of the display module according to the present embodiment, FIG. 3 is an exploded perspective view illustrating the rear side of the display module according to the present embodiment, FIG. 4 is a front view illustrating the inside of the display module according to the present embodiment, and FIG. 5 is a partially cut-away perspective view illustrating an example in which a power cable according to the present embodiment is accommodated in an inner plate The display module 2 may include a unit frame 50, an inner plate 60, a control board 70, a power supply unit 80, and a back cover 90.

The front display assembly 20 may be disposed in front of the inner plate 60. The front display assembly 20 may cover the front surface of the inner plate 60.

The front display assembly 20 may include at least one display panel, and a plurality of display panels 21, 22, 23, 24, 25, and 26 may be provided.

Each of the plurality of display panels 21, 22, 23, 24, 25, and 26 may include a plurality of display elements and a substrate 28 (see FIGS. 3 and 5) having the plurality of display elements.

An example of the display element provided on the substrate 28 may be an LED, specifically a micro LED. Each of the plurality of display panels 21, 22, 23, 24, 25, and 26 may be a micro LED panel including a plurality of micro LEDs.

The front display assembly 20 may include a plurality of display panels 21, 22, 23, 24, 25, and 26 and a display holder 30.

The display panels 21, 22, 23, 24, 25, and 26 may be disposed on the front surface of the display holder 30 and supported by the display holder 30.

The number of display holders 30 may be less than the number of display panels 21, 22, 23, 24, 25, and 26.

The display holder 30 can support a plurality of display panels 21, 22, 23, 24, 25, and 26 at the rear of the plurality of display panels 21, 22, 23, 24, 25, and 26.

One display holder 30 may support all of the plurality of display panels 21, 22, 23, 24, 25, and 26, and the plurality of display holders 31 and 32 may also support in a state of dividing a plurality of displays 21, 22, 23, 24, 25, and 26. For example, as illustrated in FIG. 3, the left display holder 32 may also support three left displays 24, 25, and 26, and the right display holder 31 may also support three right displays 21, 22, and 23.

A front connector 29 (refer to FIG. 3) that is detachable from a rear connector 72 to be described below may be disposed on the front display assembly 30.

The front connector 29 may be provided on each of the display panels 21, 22, 23, 24, 25, and 26. The front connectors 29 may be disposed on rear surfaces of the display panels 21, 22, 23, 24, 25, and 26. The front connector 29 may protrude from the rear surface of the substrate 28.

The number of front connectors 29 may be the same as the number of display panels 21, 22, 23, 24, 25, and 26. The front connector 29 and the display panels 21, 22, 23, 24, 25, and 26 may correspond 1:1.

The display holder 30 may have an opening 30a (refer to FIG. 3) through which the front connector 29 passes.

The unit frame 50 may form an outer appearance of the edge of the display module 2. The unit frame 50 may be formed in a substantially rectangular frame shape, and a hollow portion may be formed therein.

As illustrated in FIGS. 2 and 3, the unit frame 50 may include an upper frame 50a and a lower frame 50b spaced apart in the up and down direction Z. The unit frame 50 may include a left frame 50c and a right frame 50d spaced apart in the left and right direction Y.

The inner plate 60 may be disposed on the unit frame 50. The inner plate 60 may be disposed in a hollow portion formed in the unit frame 50. The inner plate 60 may be fastened to the unit frame 50 with a fastening member such as a screw.

An inner opening 62 (see FIGS. 2 to 4) may be formed in the inner plate 60. At least one of the front connector 29 and the rear connector 72 described below may pass through the inner opening 62. The front connector 29 may be connected to the rear connector 72.

The inner opening 62 may be larger than each of the front connector 29 and the rear connector 72.

The display module 2 may include an EMI gasket 66 as illustrated in FIGS. 2 to 4. An EMI gasket 66 may be disposed on the inner plate 60.

The EMI gasket 66 may be disposed through the inner plate 60 or disposed on the front surface of the inner plate 60.

An opening through which the EMI gasket 66 passes may be formed in the inner plate 60, and one example of the EMI gasket 66 may pass through the opening formed in the inner plate 60.

Another example of the EMI gasket 66 may be attached to the front surface of the inner plate 60.

A front surface of the EMI gasket 66 may be in contact with the display holder 30 and a rear surface of the EMI gasket 66 may be in contact with the control board 70 or the inner plate 60.

One example of the EMI gasket 66 may be a conductive sponge with relatively high resistance.

The EMI gasket 66 may be elongated in the left and right direction Y. A portion of the EMI gasket 66 may be located in front of the power cable accommodation portion 64 to be described later.

The display holder 30 may include a gasket contact portion 30d (see FIG. 3) which is in contact with the front surface of the EMI gasket 66.

The gasket contact portion 30d may be a bridge formed to be elongated in the left and right direction of the display holder 30.

The display holder 30 may be in contact with the EMI gasket 66 through the gasket contact portion 30d, and the grounding of the display module 2 can be strengthened.

As illustrated in FIGS. 2 and 3, the control board 70 may be disposed behind the inner plate 60. The control board 70 may be a control unit that controls overall operations of the display module 2.

The control board 70 may be coupled to the unit frame 50 or the inner plate 60. The control board 70 may be coupled to the unit frame 50 or the inner plate 60 with a fastening member such as a screw or an adhesive member such as double-sided tape and may be supported by the unit frame 50 or the inner plate 60.

The control board 70 may be fastened to the inner plate 60 and may be disposed on the rear surface of the inner plate 60. When the inner plate 60 is separated from the unit frame 50, the control board 70 can be separated together with the inner plate 60.

A heat dissipation plate 76 (see FIGS. 2 and 3) may be disposed on the rear surface of the control board 70. The heat dissipation plate 76 may include a heat pipe. The heat dissipation plate 76 may be positioned between the control board 70 and the back cover 90 and the heat dissipation plate 76 may absorb and dissipate heat from the control board 70.

A rear connector 72 (see FIG. 2) to be connected to the display panels 21, 22, 23, 24, 25, and 26 may be provided on the front surface of the control board 70. A plurality of rear connectors 72 may be provided on the front surface of the control board 70. The rear connector 72 may correspond 1:1 to the front connector 29. The number of rear connectors 72 may be the same as the number of display panels 21, 22, 23, 24, 25, and 26.

A portion of either of the front connector 29 and the rear connector 72 may be inserted into the other one. One of the front connector 29 and the rear connector 72 may be a male connector, and the other of the front connector 29 and the rear connector 72 may be a female connector inserted into the male connector.

The power supply unit 80 illustrated in FIGS. 2 to 4 may supply DC power to the control board 70.

The power supply unit 80 may include a DC power supply unit and an accommodation body 82 in which the DC power supply unit is accommodated.

The power supply unit 80 may be disposed to be elongated in the up and down direction Z.

The accommodation body 82 may be coupled to the unit frame 50 or the inner plate 60.

At least one of the front and rear surfaces of the accommodation body 82 may be opened and the DC power supply unit may be inserted into and accommodated in the accommodation body 82.

The accommodation body 82 may include an upper fastening body 84 fastened to the unit frame 50 or inner plate 60 with fastening members such as screws, and a lower fastening body 86 fastened to the unit frame 50 or inner plate 60 with fastening members such as screws.

The upper fastening body 84 may protrude above the accommodation body 82, and the lower fastening body 86 may protrude below the accommodation body 82.

The power supply unit 80 may further include a connection cable 88 (see FIGS. 2 and 3) connecting the DC power supply unit and the control board 70. One end of the connection cable 88 may be connected to the DC power supply unit, and the other end of the connection cable 88 may be connected to the control board 70.

The power supply unit 80, in particular, the accommodation body 82 may be fastened to the inner plate 60 and may be disposed on the rear surface of the inner plate 60. When the inner plate 60 is separated from the unit frame 50, the power supply unit 80 can be separated together with the inner plate 60.

When the power supply unit 80 is fastened to the inner plate 60, the power supply unit 80 may be spaced apart from the control board 70 in the left and right direction.

The back cover 90 may cover the control board 70. The back cover 90 may be larger than the control board 70 and may cover the control board 70 and the power supply unit 80 at the rear of the control board 70.

The back cover 90 may be coupled to at least one of the unit frame 50 and the inner plate 60 using a fastening member such as a screw.

The back cover 90 may be made of a plurality of members. The back cover 90 may include a main back cover 92 having an opening 91 formed on the lower portion thereof and a cable cover 94 opening and closing the opening 91.

The main back cover 92 may be fastened to the rear surface of the unit frame 50 with a fastening member such as a screw.

The cable cover 94 may be disposed under the main back cover 92. The cable cover 94 may be fastened to at least one of the unit frame 50, the inner plate 60, and the main back cover 92 with a fastening member such as a screw.

The display module 2 may include a holding mechanism for holding the front display assembly 20 in the front of the unit frame 50. The holding mechanism may attach the front display assembly 20 to the unit frame 50 using magnetic force. The front display assembly 20 may be detachably coupled to the unit frame 50 by a holding mechanism.

The display module 2 may include a magnet 52 (see FIG. 2) and an adjustment screw 40 (see FIG. 3) that can be detached from the magnet 52 by magnetic force.

The magnet 52 and the adjustment screw 40 may constitute a holding mechanism for holding the front display assembly 20 to the unit frame 50.

The magnet 52 may be disposed on at least one of the unit frame 50 and the inner plate 60, and may be disposed on the front surface of the unit frame 50, for example, as illustrated in FIG. 2. The magnet 52 may be fastened to the unit frame 50 with a fastening member such as a screw.

As illustrated in FIG. 3, the adjustment screw 40 may be screwed to the front display assembly 20. The adjustment screw 40 may be formed of a material that adheres to the magnet 52. The adjustment screw 40 is preferably disposed in the display holder 30 among the display panels 21, 22, 23, 24, 25, and 26 and the display holder 30. A portion of the adjustment screw 40 may be disposed on the rear surface of the display holder 30 so as to protrude backward. The adjustment screw 40 may be fastened to the display holder 30 so that the length protruding from the rear of the display holder 30 (length in the front and rear direction) is variable.

The adjustment screw 40 may include a threaded portion and a head portion.

The threaded portion may be screwed into a fastening hole formed in the display holder 30.

The head portion may extend to protrude from the threaded portion.

When the threaded portion is screwed and inserted into the fastening hole of the display holder 30, the head portion may be located at the rear of the display holder 30, and in close contact with the front surface of the magnet 52 at the rear position of the display holder 30.

An adjustment hole 54 (see FIG. 2) facing the adjustment screw 40 may be formed in the unit frame 50. The adjustment hole 54 may be formed in an area close to the magnet 52 of the unit frame 50. The adjustment hole 54 may face the adjustment screw 40 when the front display assembly 20 is attached to the unit frame 50.

An assembler or service provider can adjust the protruding width (front and rear direction length) of the adjustment screw 40 through the adjustment hole 54.

A person who assembles the display device 1 (hereinafter, referred to as an assembler) may insert a finger or a tool into the adjustment hole 54 and rotate the adjustment screw 40 in the clockwise direction or in the counterclockwise direction when assembling the display device. When the adjustment screw 40 rotates, the adjustment screw 40 may move forward or backward based on the magnet 52 in a state of being attached to the magnet 52.

In other words, the operator can move the front display assembly 20 forward and backward without disassembling the display device.

The front surfaces of the plurality of front display assemblies 20 included in the display device 1 may be adjusted to match. In other words, the assembler can easily adjust the step difference of the plurality of display panels 21, 22, 23, 24, 25, and 26 without disassembling the display device 1.

The unit frame 50 may be provided with guide pins 56 (see FIGS. 3 and 4). The guide pin 56 may protrude from the upper end of the unit frame 50. A guide groove (or guide hole) into which a guide pin of another adjacent display module can be inserted may be formed on the lower portion of the unit frame 50.

In the plurality of display modules, as illustrated in FIG. 1, some display modules (2 and 3: upper display modules) may be seated on other display modules (4 and 5: lower display modules). When the upper display modules 2 and 3 are placed on the lower display modules 4 and 5, the guide pins 56 of the lower display modules 4 and 5 may be inserted into the guide grooves (or guide hole) of the upper display modules 2 and 3.

The assembler can simply and quickly assemble the display device 1 by fitting the guide pins 56 of the lower display modules 4 and 5 to the guide grooves (or guide holes) of the upper display modules 2 and 3.

The display module 2 may include a power docking module 100 as illustrated in FIGS. 2 to 4.

The power docking module 100 may pass through the display module 2 in an up and down direction. The power docking module 100 may pass through the upper frame 50a and the lower frame 50b.

The power docking module 100 may include a first power connector 102, a second power connector 104, and a power cable 106.

The first power connector 102 may be disposed on the upper end of the unit frame 50. The first power connector 102 may be disposed on the upper frame 50a. The first power connector 102 may be a male connector protruding from the upper end of the unit frame 50.

The second power connector 104 may be disposed at the lower end of the unit frame 50. The second power connector 104 may be disposed on the lower frame 50b. The second power connector 104 may be a female connector disposed at a lower end of the unit frame 50 and a male connector inserted in an up and down direction.

The power cables 106 may be respectively connected to the first power connector 102 and the second power connector 104. One end of the power cable 106 may be connected to the first power connector 102. The other end of the power cable 106 may be connected to the second power connector 104.

The power cable 106 may be accommodated in the power cable accommodation portion 64 formed in the inner plate 60.

As illustrated in FIGS. 3 to 5, the power cable accommodation portion 64 may be formed to be elongated in the inner plate 60 in the up and down direction. The power cable accommodation portion 64 may be formed between the first power connector 102 and the second power connector 104.

The power cable accommodation portion 64 may be formed by bending the inner plate 60. The power cable accommodation portion 64 may have an opened upper, lower, and front surface. The power cable accommodation portion 64 may be formed by being recessed into the inner plate 60. The power cable accommodation portion 64 may protrude from the inner plate 60 in a rearward direction.

The power cable 106 may extend in an up and down direction Z along the power cable accommodation portion 64.

The display holder 30 may face the power cable accommodation portion 64 except for the opening 30a. The display holder 30 may include a power cable cover portion 30b (see FIGS. 3 and 5).

The power cable cover portion 30b may face the power cable accommodation portion 64 in the front and rear direction X. The power cable cover portion 30b may be a bridge formed on the display holder 30 to be elongated in the up and down direction Z.

The power cable cover portion 30b may protect the power cable 106 together with the power cable accommodation portion 64. The power cable cover portion 30b and the power cable accommodation portion 64 may shield the front and rear of the power cable 106.

AC power may flow through the power docking module 100, and the power docking module 100 may be connected to the DC power supply unit of the power supply unit 80 with a cable 108 and a connector 109, AC power may be applied to a DC power supply unit of a power supply unit 80.

One of the plurality of display modules 2, 3, 4, and 5 illustrated in FIG. 1 may supply AC power to the other. When one 2 of the plurality of display modules 2, 3, 4, and 5 is seated on the other one 4 of the plurality of display modules 2, 3, 4, and 5, the power docking module 100 of the display module 2 located at the upper side thereof may be connected to the power docking module 100 of the display module 4 located below.

The second power connector 104 of any one 2 of the plurality of display modules 2, 3, 4, and 5 is the other one 4 of the plurality of display modules 2, 3, 4, and 5 and the plurality of display modules 2, 3, 4, and 5 may be sequentially connected to power.

The display module 2 may include a communication module 110 as illustrated in FIGS. 2 and 3.

The communication module 110 may be respectively disposed on the upper end and the lower end of the unit frame 50.

The communication module 110 may include a first communication module 112 and a second communication module 114.

The first communication module 112 may be disposed on the upper frame 50a. The first communication module 112 may be disposed spaced apart from the first power connector 102 at the upper end of the unit frame 50.

The second communication module 114 may be disposed on the lower frame 50b. The second communication module 114 may be disposed spaced apart from the second power connector 104 at the lower end of the unit frame 50.

Each of the first communication module 112 and the second communication module 114 may be configured as a wireless signal module and may be communicatively connected without a separate cable.

The plurality of display modules 2, 3, 4, and 5 illustrated in FIG. 1 may be communicatively connected to each other.

When one 2 of the plurality of display modules 2, 3, 4, and 5 is seated on the other one 4 of the plurality of display modules 2, 3, 4, and 5, the second communication module 114 of the display module 2 located on the upper side can face the first communication module 112 of the display module 4 located on the lower side in the up and down direction Z, and the second communication module 114 of the display module 2 located on the upper side may be communicatively connected to the first communication module 112 of the display module 4 located at the lower side.

A plurality of display modules 2, 3, 4, and 5 may be installed in a stacking manner, and the power docking module 100 and the communication module 100 may communicate/electrically connect adjacent display modules.

As described above, when the power docking module 100 and the communication module 110 are provided in the unit frame 50, the power docking module 100 and the communication module 110 are not well visible from the outside, and the display device 1 can be upgraded.

As illustrated in FIG. 4, the display device may further include an EMI gasket 116 disposed on the unit frame 50. The EMI gasket 116 may be disposed on the front surface of the unit frame 50. EMI gasket 116 may be disposed closer to the communication module 110 than the power docking module 100. The EMI gasket 116 may block electromagnetic waves of the communication module 110. The EMI gasket 116 may be closer to the first communication module 112 than the first power connector 102 and the power cable 106.

The EMI gasket 66 disposed on the inner plate 60 may be referred to as an inner plate EMI gasket 66, and the EMI gasket 116 disposed on the unit frame 50 may be referred to as an unit frame EMI gasket 116.

The mounting height of the unit frame EMI gasket 116 may be higher than the mounting height of the inner plate EMI gasket 66. The number of unit frame EMI gaskets 116 may be less than the number of inner plate EMI gaskets 66. The size of the unit frame EMI gasket 116 may be smaller than the size of the inner plate EMI gasket 66.

The inner plate EMI gasket 66 may be a main EMI gasket, and the unit frame EMI gasket 116 may be a sub EMI gasket.

FIG. 6 is an enlarged perspective view illustrating a unit frame according to the present embodiment, and FIG. 7 is a cross-sectional view illustrating a state when adjusting the position of the front display assembly according to the present embodiment.

The display module 2 may further include a set screw 130 (see FIG. 7) for adjusting the position of the display holder 30. The position of the front display assembly 20 may be finely adjusted by the set screw 130.

A contact portion with which the set screw 130 can be in contact may be formed in the display holder 30. An example of the contact portion may be a position adjustment protrusion 33 (see FIG. 7), and the position adjustment protrusion 33 may protrude from the display holder 30.

The unit frame 50 may have fastening holes 57 and 58 opened toward the position adjustment protrusion 33. The fastening holes 57 and 58 may include the first fastening hole 57 of the upper frame 50a or the lower frame 50b opened in the up and down direction Z and a second fastening hole 58 of the left frame 50c or the right frame 50d opened in the left and right direction Y.

A plurality of position adjustment protrusions 33 may be formed. The position adjustment protrusion 33 may include an upper and lower adjustment protrusion 34 (see FIG. 10) that protrudes from the display holder 30 and faces the first fastening hole 57. The position adjustment protrusion 33 may include a left and right adjustment protrusion 35 (see FIG. 10) that protrudes from the display holder 30 and faces the second fastening hole 58.

In one example of the unit frame 50, the upper and lower adjustment protrusions 34 and the left and right adjustment protrusions 35 may be formed to be spaced apart from each other.

In another example of the unit frame 50, the upper and lower adjustment protrusions 34 and the left and right adjustment protrusions 35 may be integrally formed.

The first fastening hole 57 may open toward the upper and lower adjustment protrusion 34 formed in the display holder 30.

The second fastening hole 58 may open toward the left and right adjustment protrusions 35 formed on the display holder 30.

The set screw 130 may be screwed into the fastening holes 57 and 58. The set screw 130 may be tightened or loosened to the fastening holes 57 and 58. The length of the portion of the set screw 130 inserted between the display holder 30 and the unit frame 50 may be different depending on the depth to which the fastening holes 57 and 58 are screwed.

The set screw 130 may be fastened to the fastening holes 57 and 58, may be in contact with the position adjustment protrusion 33, and may push the position adjustment protrusion 33 out.

When the set screw 130 is fastened to the first fastening hole 57 and pushes the first rib, the front display assembly 20 may be moved in the up and down direction Z, and the plurality of display panels 21, 22, 23, 24, 25, and 26 may be positioned in the up and down direction Z by the set screw 130.

When the set screw 130 is fastened to the second fastening hole 58 and pushes the second rib out, the front display assembly 20 can be moved in the left and right direction Y, and the positions of the plurality of display panels 21, 22, 23, 24, 25, and 26) can be adjusted in the left and right direction Y by the set screw 130.

FIG. 8 is a perspective view illustrating a state when a rear connector and a front connector according to the present embodiment are connected, and FIG. 9 is a cross-sectional view illustrating a state when a rear connector and a front connector according to the present embodiment are connected.

Any one of the front connector 29 and the rear connector 72 may be a floating connector that can be moved in the up and down direction Z and in the left and right direction Y.

The floating connector may include a fixed connector 122 and a moving connector 126.

A space 123 in which the movable connector 126 is movably accommodated may be formed inside the fixed connector 122. A stopper 124 may be formed in the fixed connector 122 to prevent the moving connector 126 accommodated in the space 123 from being arbitrarily removed.

The movable connector 126 may be disposed on the fixed connector 122 so as to be movable in an up and down direction Z and in a left and right direction Y.

When the rear connector 72 is a floating connector, the fixed connector 122 may be fixed to the front surface of the control board 70.

When the rear connector 72 is a floating connector, pins connected to each other may be formed in each of the moving connector 126 and the front connector 29, and the moving connector 126 may be movably accommodated in the fixed connector 122 and detachable from the front connector 29.

When the front connector 29 is a floating connector, the fixed connector 122 may be fixed to the rear surface of the substrate 28.

When the front connector 29 is a floating connector, pins connected to each other may be formed in each of the moving connector 126 and the rear connector 72, and the moving connector 126 may be movably accommodated in the fixed connector 122 and detachable from the rear connector 72.

The front display assembly 20 of any one of the display panels 2, 3, 4, and 5 may move in close contact with the front display assembly of the other adjacent display panel.

Since the plurality of front display assemblies 20 may be moved by the floating connector, the plurality of front display assemblies 20 may be in close contact with each other so that the boundary between them is not easily visible from the outside, and the display device 1 may form a seamless LED screen.

FIG. 10 is a view illustrating a portion of the display holder according to the present embodiment, and FIG. 11 is a view illustrating a portion of a unit frame according to the present embodiment.

FIG. 10 is a view illustrating the rear surface of the display holder, and FIG. 11 is a view illustrating the front surface of the unit frame.

When the position of the front display assembly 20 is adjusted by the set screw 130 (see FIG. 7) illustrated in FIG. 7, one of the set screws is in contact with the upper and lower adjustment protrusions 34 illustrated in FIG. 10 to push the upper and lower adjustment protrusion 45 in the up and down direction Z, and the position of the front display assembly 20 may be adjusted in the up and down direction Z. In addition, the other set screw may be in contact with the left and right adjustment protrusions 35 illustrated in FIG. 10 to push the left and right adjustment protrusions 35 in the left and right direction Y, and the position of the front display assembly 20 may be adjusted in the left and right direction Y.

It is preferable that the front display assembly 20 is not excessively moved by the set screw.

If the front display assembly 20 is moved excessively in a state where the front connector 29 (see FIG. 8) is connected to the rear connector 72 (see FIG. 8), the front connector 29 or the rear connector 72 may be damaged or broken.

In order to prevent damage to the front connector 29 or the rear connector 72 as described above, a limiter (or stopper) for limiting excessive movement of the display holder 30 may be formed on at least one of the display holder 30 and the unit frame 50.

A holder protrusion may be formed on the rear surface of the display holder 30. When the display holder 30 moves excessively in the up and down direction Z or in the left and right direction Y, the holder protrusion may be caught on the unit frame 50.

An example of the holder protrusion may be formed separately from the position adjustment protrusion 33, and the holder protrusion may be formed to be spaced apart from the position adjustment protrusion 33.

Another example of the holder protrusion may be integrally formed with the position adjustment protrusion 33. In this case, one of the upper and lower adjustment protrusions 34 and the left and right adjustment protrusions 35 may be a holder protrusion.

Hereinafter, a case where the upper and lower adjustment protrusions 34 are holder protrusions will be described, and the same reference numerals will be used for the upper and lower adjustment protrusions and the holder protrusions.

The holder protrusion 34 may protrude from the rear surface of the display holder 30 to be positioned around the adjustment screw 40. The holder protrusion 34 may be formed to surround a portion of the outer circumference of the adjustment screw 40. The holder protrusion 34 may be formed in a shape surrounding a lower portion and the side of the adjustment screw 40.

A plurality of holder protrusions 34 may be provided in the display holder 30.

When the front display assembly 20 is seated on the unit frame 50, the rear surface of the holder protrusion 34 may be seated on the front surface of the seating protrusion 51 (see FIG. 11) protruding from the unit frame 50.

As illustrated in FIG. 11, the seating protrusion 51 may protrude from the unit frame 50 to be positioned around the magnet 52.

A user or an assembler may adjust the step difference by turning the adjustment screw 40 in a state where the rear surface of the holder protrusion 34 is seated on the front surface of the seating protrusion 51 (see FIG. 11).

Meanwhile, frame protrusions 55 may be formed on the front surface of the unit frame 50. When the display holder 30 moves excessively in the up and down direction Z or in the left and right direction Y, the display holder 30 may be caught on the frame protrusion 55, and the movement thereof may be limited by the frame protrusion 55.

A plurality of frame protrusions 55 may be provided in the unit frame 50.

The frame protrusion 55 may protrude from the unit frame 50 to be positioned around the magnet 52. The frame protrusion 55 may be connected to the seating protrusion 51. A protrusion width of the frame protrusion 55 may be greater than a protrusion width of the seating protrusion 51.

The frame protrusion 55 may function as a limiter together with the holder protrusion 34.

To adjust the front display assembly 20, when moving the front display assembly 20 in the up and down direction Z or in the left and right direction Y, one end 34a of the holder protrusion 34 may be in contact with the one end 55a of the frame protrusion 55, the holder protrusion 34 may be caught on the frame protrusion 55, and the movement of the display holder 30 including the holder protrusion 34 may be limited.

FIG. 12 is a perspective view illustrating a wall mounter according to the present embodiment, FIG. 13 is a perspective view illustrating a state when the display module according to the present embodiment is positioned in front of the wall mounter, FIG. 14 is a perspective view illustrating a state when a mounting pin of a display module is inserted into a wall mounter according to the present embodiment, FIG. 15 is a perspective view illustrating a state when the display module illustrated in FIG. 14 is lowered, and FIG. 16 is a cross-sectional view illustrating a state when the display module illustrated in FIG. 15 is raised.

The display device 1 may include a wall mounter 150 on which the display module 2 is mounted.

The wall mounter 150 may be mounted on a wall. The wall mounter 150 may be disposed to be elongated in the up and down direction Z on the wall. The display device 1 may include a plurality of wall mounters 150, and the plurality of wall mounters 150 may be spaced apart from each other at a set pitch in the left and right direction Y.

A plurality of wall mounters 150 may have the same structure, and one wall mounter 150 will be described below.

A mounting hole 152 on which the display module 2 may be mounted may be formed in the wall mounter 150.

The wall mounter 150 may include an inner mounter 156 and an outer mounter 158.

The inner mounter 156 may be fixedly mounted to the wall W with a fastening member such as a screw.

The outer mounter 158 may be fastened to the inner mounter 156 using a fastening member such as a screw. An adjustment hole 159 through which a fastening member passes may be formed in the outer mounter 158. The adjustment hole 159 may be formed to be elongated in the front and rear direction X, and the outer mounter 158 may be assembled to the inner mounter 156 to be position-adjustable in the front and rear direction X.

The outer mounter 158 may be formed in a '☐' shape, and a space in which the inner mounter 153 is accommodated may be formed inside the outer mounter 158.

As illustrated in FIG. 13, the display module 2 may be moved to the plurality of wall mounters 150 and then mounted on the plurality of wall mounters 150.

The display module 2 may include a rear pin 160 (see FIGS. 13 to 16) mounted on the wall mounter 150. The rear pin 160 may be disposed to protrude rearward from the unit frame 50.

The rear pin 160 may be screwed to the unit frame 50.

The rear pin 160 may include a fastening body 162 (see FIG. 16) to which it is fastened.

A rear pin fastening portion 59 to which the rear pin 160 is fastened may be formed on the unit frame 50. The rear pin fastening portion 59 may protrude from the unit frame 50 in the rear direction. The rear pin fastening portion 59 may have a fastening hole into which the fastening body 162 of the rear pin 160 may be screwed.

The rear pin 160 may be mounted in a mounting hole 152 formed in the wall mounter 160.

A rear head 164 may be formed on the rear fin 190. The rear head 164 may protrude from the rear end of the fastening body 162. As illustrated in FIG. 14, the rear head 164 is inserted into the wall mounter 150 so as to pass through the mounting hole 152, and after passing through the mounting hole 152, as illustrated in FIG. 15, the rear head 164 may be caught on the peripherical portion 154a of the mounting hole 152.

The mounting hole 152 may be formed in the outer mounter 158. The mounting hole 152 may be formed to be opened to the outer mounter 158 in the front and rear direction X.

The mounting hole 152 may include an upper mounting hole 153 and a lower guide hole 154.

The area of the upper mounting hole 153 may be larger than that of the rear head 164, and the rear head 164 may be inserted into the upper mounting hole 153 and pass through the upper mounting hole 153.

The lower guide hole 154 may extend to be elongated downward from the upper mounting hole 152. The width of the lower guide hole 154 in the left and right direction Y may be shorter than that of the rear head 164 in the left and right direction Y.

As illustrated in FIG. 14, the rear head 164 passing through the upper mounting hole 153 may move downward along the lower guide hole 154. As illustrated in FIG. 15, the rear head 164 may be caught on the peripheral portion 154a of the lower guide hole 154 in the forward direction.

When the rear head 164 is positioned behind the lower guide 154, the display module 2 may be supported by the wall mounter 150.

Meanwhile, the display module 2 can be separated from the wall mounter 150 for the service thereof, and the rear pin 160, as illustrated in FIG. 16, moves from the lower guide hole 154 to the upper mounting hole 153 and then may be drawn out in the forward direction of the upper mounting hole 153.

When the rear pin 160 is moved from the lower guide hole 154 to the upper mounting hole 153, the rear head 164 is preferably not caught on the peripheral portion 153a of the upper mounting hole 153.

As illustrated in FIG. 16, a protrusion 59a may be formed on the rear pin fastening portion 59.

The protrusion 59a may prevent interference between the rear head 164 and the peripheral portion 153a of the upper mounting hole 153. The protrusion 59a may protrude toward the rear head 164 from the rear pin fastening portion 59. The protrusion 59a may protrude rearward from the rear end of the rear pin fastening portion 59. The front end of the rear head 164 may be in contact with the rear end of the protrusion 59a.

When mounting the rear pin 160 to the mounting hole 152, the protrusion 59a can be inserted into the upper mounting hole 153 together with the rear head 164.

When the rear pin 160 is moved from the lower guide hole 154 to the upper mounting hole 153, the protrusion 59a can be located inside the upper mounting hole 153, as illustrated in FIG. 16, and may be in contact with the wall mounter 150.

The protrusion 59a may be escaped from the upper mounting hole 153 together with the rear head 164 in the forward direction.

FIG. 17 is a view illustrating an example of disassembling a display device for service of the display device according to the present embodiment.

Some parts of the display device 1 may be disassembled during service such as AS.

First, as illustrated in FIG. 17(a), in a state where the front display assembly 20 is fixed to the unit frame 50, the front display assembly 20 can be moved forward, and the front display assembly 20 may be separated from the unit frame 50, as illustrated in FIG. 17(b).

When the front display assembly 20 is separated, as illustrated in FIG. 17(c), the front surface of the unit frame 50, the front surface of the inner plate 60, the power docking module 100, and the communication module 100 may be exposed, and the power docking module 100 and the communication module 100 may be separated from the unit frame 50, as illustrated in FIG. 17(d).

A service provider can service the power docking module 100 and the communication module 100 by simply separating the power docking module 100 and the communication module 100 after separating the front display assembly 20.

FIG. 17(e) is a view illustrating the display module 2 when both the power docking module 100 and the communication module 100 are separated, and the service provider, as illustrated in FIG. 17(f), may separate the inner plate 60 from the unit frame 50, and the control board 70 and the power supply unit 80 disposed on the rear surface of the inner plate 60 can be separated together with the inner plate 60, and the control board 70 and the power supply unit 80 may be separated from the inner plate 60.

The service provider may service the control board 70 or power supply unit 80 by simply separating the front display assembly 20 and the inner plate 60 without separating the back cover 90 in a state where the unit frame 50 is mounted on the wall mounter 150.

FIG. 18 is a view illustrating another example of disassembling a display device for service of the display device according to the present embodiment.

A service provider may separate the back cover 90 as illustrated in FIG. 18(b) without disassembling the front display assembly 20 in order to service the control board 70 or the power supply unit 80.

The display module 2 can be separated from the wall mounter 150, and the main back cover 92 and cable cover 94 illustrated in FIG. 18(a) may be separated as illustrated in FIG. 18(b).

When the back cover 90 is separated, the control board 70 and the power supply unit 80 disposed on the rear surface of the inner plate 60 can be exposed as illustrated in FIG. 18(c), and the service provider may separate the control board 70 and the power supply unit 80 in the rear direction, as illustrated in FIG. 18(d).

A service provider may service the control board 70 or the power supply unit 80 by simply separating the back cover 90 without separating the front display assembly 20 from the unit frame 50.

Depending on the installation environment of the display device 1, the service provider may also perform service after opening the front surface of the display module, as illustrated in FIG. 17, and may also perform service after opening the rear surface of the display module 2, as illustrated in FIG. 18.

The above description is merely an example of the technical idea of the present disclosure, and various modifications and variations can be made to those skilled in the art without departing from the essential characteristics of the present disclosure.

Therefore, the embodiments disclosed in the present disclosure are not intended to limit the technical idea of the present disclosure, but to explain, and the scope of the technical idea of the present disclosure is not limited by these embodiments.

The protection scope of the present disclosure should be construed according to the following claims, and all technical ideas within the equivalent range should be construed as being included in the scope of the present disclosure.

The invention claimed is:

1. A display device including a plurality of display modules arranged in an up and down direction and a left and right direction,
wherein each display module includes:
a unit frame;
an inner plate coupled to the unit frame, the inner plate having an inner opening;
a control board disposed behind the inner plate, the control board having a front surface and a rear connector on the front surface;
a back cover covering the control board; and
a front display assembly disposed in front of the unit frame, the front display assembly including:
at least one display panel; and
a front connector detachable from the rear connector,
wherein at least one of the rear connector and the front connector passes through the inner opening, and
wherein the rear connector includes:
a fixed connector fixed to the front surface of the control board, the fixed connector having a space formed therein; and
a moving connector movably accommodated in the space in the up and down direction and in the left and right direction, the moving connector being detachable from the front connector.

2. The display device of claim 1, further comprising:
a magnet disposed on a front surface of the unit frame; and
an adjustment screw screwed to the front display assembly, the adjustment screw being attachable to the magnet by magnetic force.

3. The display device of claim 2, wherein the unit frame includes an adjustment hole for the adjustment screw.

4. The display device of claim 1, wherein the front display assembly further includes:
a display holder having a front surface on which the at least one display panel is located; and
a position adjustment protrusion, the position adjustment protrusion protruding from the front surface of the display holder, and
wherein the unit frame includes:
a fastening hole opened toward the position adjustment protrusion; and
a set screw configured to adjust a position of the display holder by tightening or loosening the set screw to the fastening hole.

5. The display device of claim 1, further comprising a guide pin protruding from an upper end of the unit frame.

6. The display device of claim 5, wherein each of the plurality of display modules comprises:
a lower display module provided with the guide pin; and
an upper display module placed on the lower display module; and
wherein the guide pin is inserted into the upper display module.

7. The display device of claim 1, wherein the display module includes a rear pin disposed to protrude rearward from the unit frame and mounted in a mounting hole formed in a wall mounter, and
wherein the rear pin has a rear head caught around the mounting hole.

8. The display device of claim 7, wherein the wall mounter includes
an inner mounter fixed to a wall; and
an outer mounter fastened to the inner mounter with a fastening member, the outer mounter having a mounting hole formed therein.

9. The display device of claim 7, wherein the mounting hole includes
an upper mounting hole larger than the rear head; and
a lower guide hole extending downward to be elongated from the upper mounting hole, and
wherein the width of the lower guide hole in the left and right direction is shorter than the width of the rear head in the left and right direction.

10. The display device of claim 9,
wherein the rear pin fastening portion to which the rear pin is fastened is formed on the unit frame,
wherein a protrusion preventing interference between the rear head and a peripheral portion of the upper mounting hole is formed on the rear pin fastening portion, and
wherein the protrusion protrudes toward the rear head.

11. The display device of claim 1, further comprising a power docking module passing through the display module in the up and down direction, wherein the power docking module includes:
a first power connector disposed on an upper end of the unit frame;

a second power connector disposed at a lower end of the unit frame; and
a power cable connected to the first power connector and the second power connector.

12. The display device of claim 1, wherein each display module includes an EMI gasket disposed on the inner plate,
wherein the front display assembly further includes a display holder,
wherein the at least one display panel is arranged on a front surface of the display holder,
wherein the at least one display panel includes a substrate having a front surface on which a display element is disposed and a rear surface on which the front connector is disposed, and
wherein the display holder includes:
an opening through which the front connector passes; and
a gasket contact portion which is in contact with a front surface of the EMI gasket.

13. A display device including a plurality of display modules arranged in an up and down direction and a left and right direction,
wherein each display module includes:
a unit frame;
an inner plate coupled to the unit frame, the inner plate having an inner opening;
a control board disposed behind the inner plate, the control board having a front surface and a rear connector on the front surface;
a back cover covering the control board; and
a front display assembly disposed in front of the unit frame, the front display assembly including:
at least one display panel; and
a front connector detachable from the rear connector,
wherein at least one of the rear connector and the front connector passes through the inner opening, and
wherein the display device further comprises:
a power docking module passing through the display module in the up and down direction, wherein the power docking module includes:
a first power connector disposed on an upper end of the unit frame;
a second power connector disposed at a lower end of the unit frame; and
a power cable connected to the first power connector and the second power connector.

14. The display device of claim 13, wherein a power cable accommodation portion, in which the power cable is accommodated, is elongated in the up and down direction on the inner plate.

15. The display device of claim 14, wherein the front display assembly further includes a display holder, the display holder having a front surface on which the at least one display panel is located,
wherein the at least one display panel includes a substrate, the substrate including:
a front surface on which a display element is located; and
a rear surface on which the front connector is located,
wherein the display holder has an opening through which the front connector passes, and
wherein a portion of the display holder other than the opening faces the power cable accommodating portion.

16. The display device of claim 13, further comprising:
a first communication module disposed to be spaced apart from a first power connector on an upper end of the unit frame; and
a second communication module disposed to be spaced apart from the second power connector at a lower end of the unit frame.

17. The display device of claim 13, further comprising a guide pin protruding from an upper end of the unit frame, and
wherein each of the plurality of display modules comprises:
a lower display module provided with the guide pin; and
an upper display module placed on the lower display module; and
wherein the guide pin is inserted into the upper display module.

18. A display device including a plurality of display modules arranged in an up and down direction and a left and right direction,
wherein each display module includes:
a unit frame;
an inner plate coupled to the unit frame, the inner plate having an inner opening;
a control board disposed behind the inner plate, the control board having a front surface and a rear connector on the front surface;
a back cover covering the control board; and
a front display assembly disposed in front of the unit frame, the front display assembly including:
at least one display panel; and
a front connector detachable from the rear connector,
wherein at least one of the rear connector and the front connector passes through the inner opening, and
wherein each display module includes an EMI gasket disposed on the inner plate,
wherein the front display assembly further includes a display holder,
wherein the at least one display panel is arranged on a front surface of the display holder,
wherein the at least one display panel includes a substrate, the substrate including:
a front surface on which a display element is located; and
a rear surface on which the front connector is located, and
wherein the display holder includes:
an opening through which the front connector passes; and
a gasket contact portion which is in contact with a front surface of the EMI gasket.

19. The display device of claim 18, further comprising a guide pin protruding from an upper end of the unit frame, and
wherein each of the plurality of display modules comprises:
a lower display module provided with the guide pin; and
an upper display module placed on the lower display module; and
wherein the guide pin is inserted into the upper display module.

20. The display device of claim 18, further comprising a power docking module passing through the display module in the up and down direction, wherein the power docking module includes:
a first power connector disposed on an upper end of the unit frame;
a second power connector disposed at a lower end of the unit frame; and a power cable connected to the first power connector and the second power connector.

\* \* \* \* \*